United States Patent
Hondo et al.

(10) Patent No.: US 9,363,907 B2
(45) Date of Patent: Jun. 7, 2016

(54) IN-VEHICLE ELECTRONIC APPARATUS

(71) Applicant: Sony Corporation, Tokyo (JP)

(72) Inventors: Asaya Hondo, Chiba (JP); Hideki Itoh, Tokyo (JP); Hisahiro Tanaka, Chiba (JP)

(73) Assignee: SONY CORPORATION, Tokyo (JP)

( * ) Notice: Subject to any disclaimer, the term of this patent is extended or adjusted under 35 U.S.C. 154(b) by 386 days.

(21) Appl. No.: 13/938,679

(22) Filed: Jul. 10, 2013

(65) Prior Publication Data

US 2014/0022716 A1 Jan. 23, 2014

(30) Foreign Application Priority Data

Jul. 19, 2012 (JP) .................. 2012-160205

(51) Int. Cl.
 *H05K 5/02* (2006.01)
 *H04B 1/08* (2006.01)

(52) U.S. Cl.
 CPC .............. *H05K 5/0221* (2013.01); *H04B 1/082* (2013.01); *H04B 2001/084* (2013.01)

(58) Field of Classification Search
 CPC ....... G11B 33/02; H05K 5/02; H05K 5/0221; H04B 1/082; H04B 2001/084; B60R 11/02
 See application file for complete search history.

(56) References Cited

U.S. PATENT DOCUMENTS

| 5,554,966 | A * | 9/1996 | Iijima | G08B 21/00 307/10.2 |
| 5,575,544 | A * | 11/1996 | Hasegawa | H04B 1/082 312/7.1 |
| 2005/0057634 | A1 * | 3/2005 | Huegle | B41J 15/042 347/109 |
| 2006/0039671 | A1 * | 2/2006 | Chigasaki | G11B 33/027 386/361 |
| 2008/0158790 | A1 * | 7/2008 | Itoh | H04B 1/3822 361/679.02 |
| 2008/0180889 | A1 * | 7/2008 | Ozaki | G01C 21/265 361/679.01 |
| 2009/0257205 | A1 * | 10/2009 | Itoh | B60R 11/02 361/747 |
| 2010/0053882 | A1 * | 3/2010 | Hayashi | B60R 11/02 361/679.43 |
| 2010/0161220 | A1 * | 6/2010 | Masuda | B60R 11/02 701/532 |
| 2012/0155006 | A1 * | 6/2012 | Wahler | G07C 5/0858 361/679.31 |
| 2013/0175905 | A1 * | 7/2013 | Sanlaville | B60R 11/0205 312/7.1 |
| 2013/0285811 | A1 * | 10/2013 | Yoshida | G08B 13/1427 340/568.1 |

FOREIGN PATENT DOCUMENTS

| JP | 09-251766 A | 9/1997 |
| JP | 2010-052489 A | 3/2010 |

\* cited by examiner

*Primary Examiner* — Jay Patel
*Assistant Examiner* — Neil Mikeska
(74) *Attorney, Agent, or Firm* — Chip Law Group

(57) ABSTRACT

Provided is an in-vehicle electronic apparatus including a main body that includes a panel attaching/detaching part, and a panel that is attached to and detached from the panel attaching/detaching part. The panel attaching/detaching part is provided with a lock mechanism and a holding lever, the lock mechanism being arranged to lock the panel to the main body, the holding lever being rotatable and being arranged to hold the panel when the holding lever is rotated to a holding position. The panel is moved in a predetermined direction with respect to the main body such that locking of the panel to the main body by the lock mechanism is released. When the panel is moved in the predetermined direction such that the locking is released, the holding lever is rotated to the holding position due to inertia such that the panel is held by the holding lever.

4 Claims, 18 Drawing Sheets

1 ··· IN-VEHICLE ELECTRONIC APPARATUS
2 ··· MAIN BODY
3 ··· PANEL

1 ··· IN-VEHICLE ELECTRONIC APPARATUS
2 ··· MAIN BODY
3 ··· PANEL

2 ··· MAIN BODY
3 ··· PANEL
15 ··· SUPPORT MEMBER
16 ··· HOLDING LEVER
17 ··· SUPPORT LEVER
32 ··· EXTENSION PART
32c ··· HOLDING PART
33 ··· WEIGHT PART

6 ··· PANEL ATTACHING/DETACHING PART
14 ··· LOCK MECHANISM
15 ··· SUPPORT MEMBER
15d ··· STOPPER PART
16 ··· HOLDING LEVER
17 ··· SUPPORT LEVER
32 ··· EXTENSION PART
32c ··· HOLDING PART

1 ··· IN-VEHICLE ELECTRONIC APPARATUS
2 ··· MAIN BODY
3 ··· PANEL
6 ··· PANEL ATTACHING/DETACHING PART
15 ··· SUPPORT MEMBER

2 ··· MAIN BODY
3 ··· PANEL
14 ··· LOCK MECHANISM
15 ··· SUPPORT MEMBER
15d ··· STOPPER PART
16 ··· HOLDING LEVER
17 ··· SUPPORT LEVER
32 ··· EXTENSION PART
32c ··· HOLDING PART

2 · · · MAIN BODY
3 · · · PANEL
6 · · · PANEL ATTACHING/DETACHING PART
14 · · · LOCK MECHANISM
15 · · · SUPPORT MEMBER
15d · · · STOPPER PART
16 · · · HOLDING LEVER
17 · · · SUPPORT LEVER
32 · · · EXTENSION PART
32c · · · HOLDING PART

2 ··· MAIN BODY
3 ··· PANEL
6 ··· PANEL ATTACHING/DETACHING PART
14 ··· LOCK MECHANISM
15 ··· SUPPORT MEMBER
15d ··· STOPPER PART
16 ··· HOLDING LEVER
17 ··· SUPPORT LEVER
32 ··· EXTENSION PART
32c ··· HOLDING PART

2 · · · MAIN BODY
3 · · · PANEL
15 · · · SUPPORT MEMBER
16 · · · HOLDING LEVER
17 · · · SUPPORT LEVER
32 · · · EXTENSION PART
32c · · · HOLDING PART
33 · · · WEIGHT PART

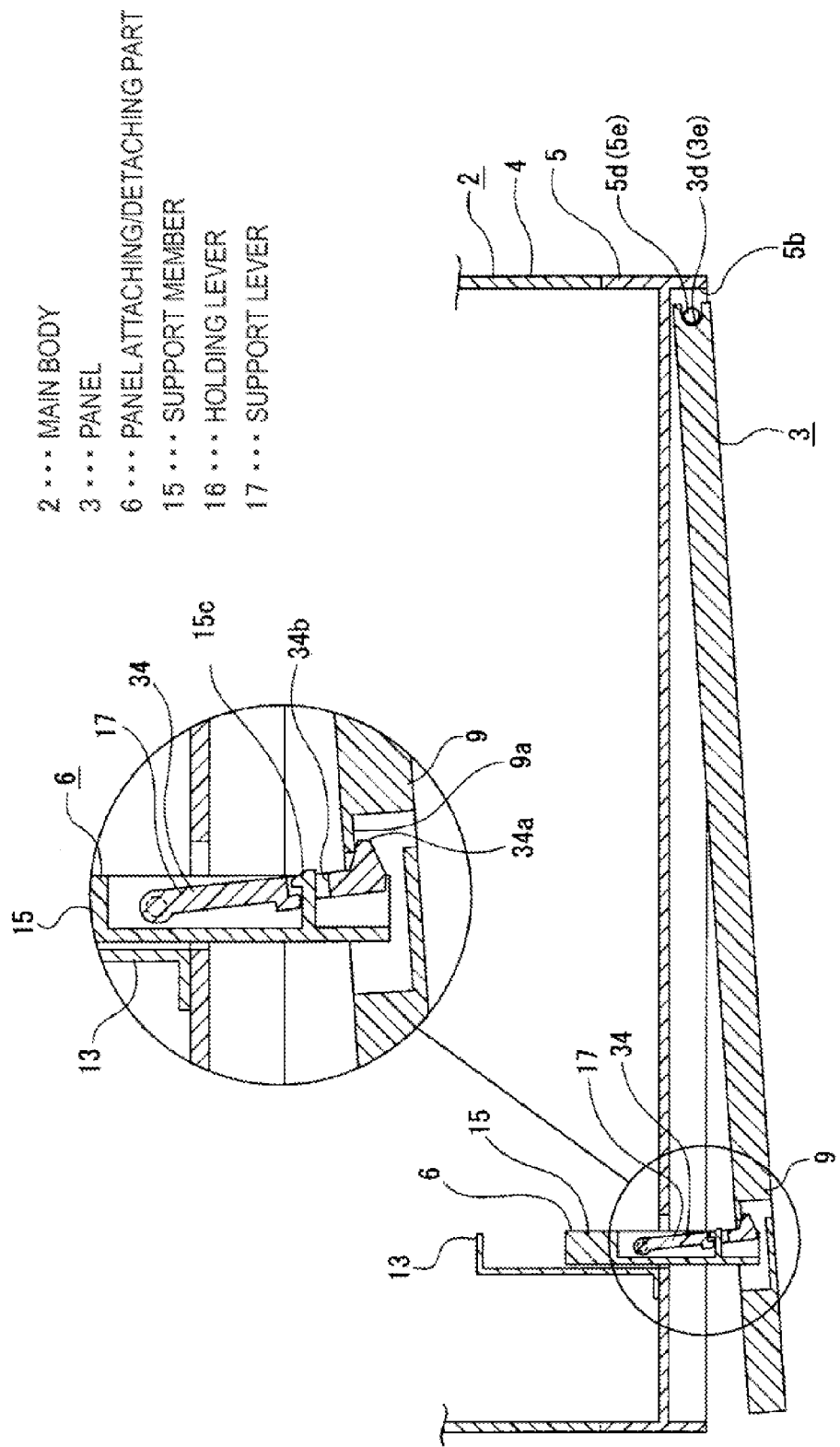

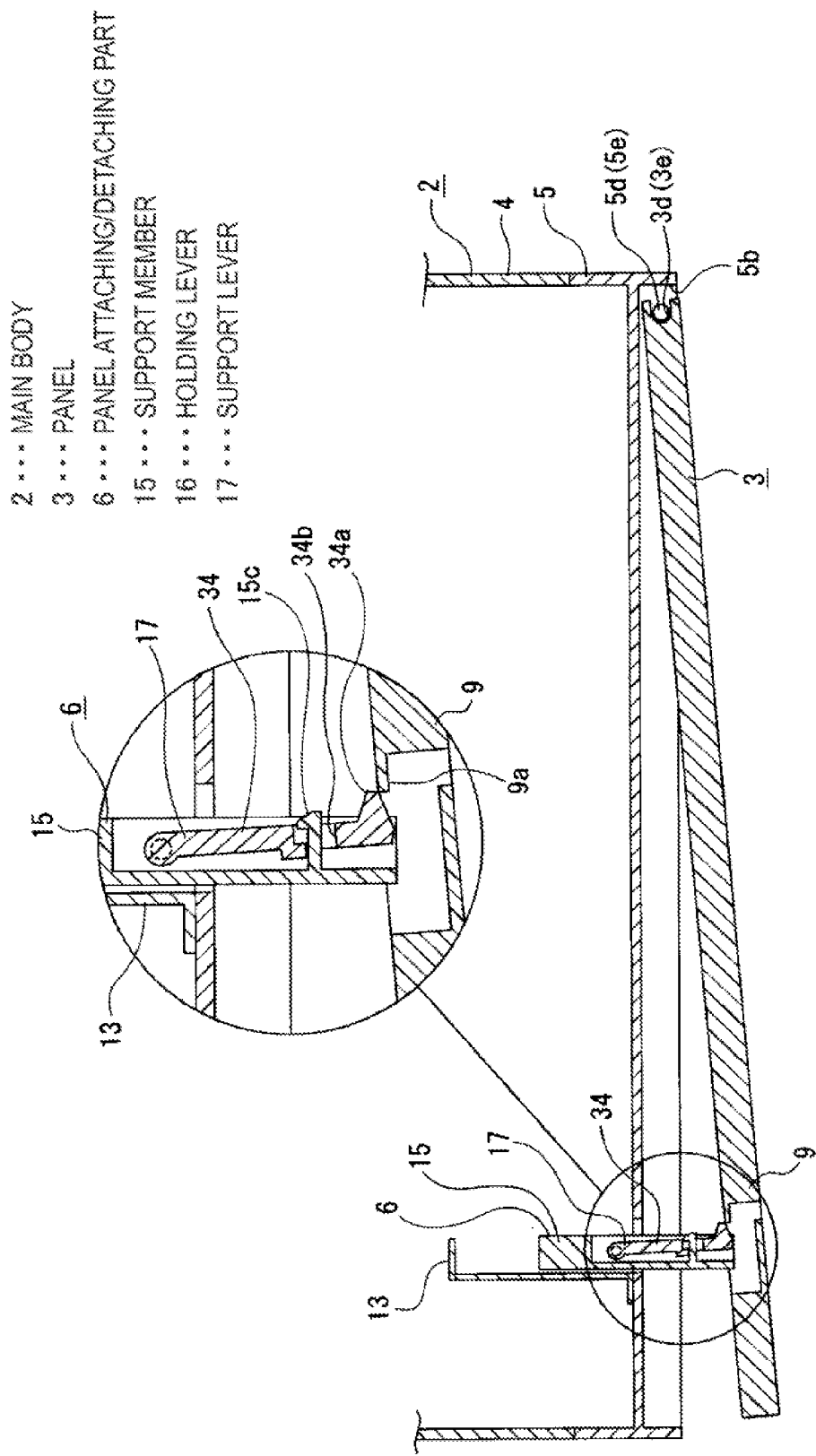

IN-VEHICLE ELECTRONIC APPARATUS

BACKGROUND

The present technology relates to the technical field of an in-vehicle electronic apparatus, and in particular to a technique in which a panel is held by a holding lever which is rotated due to inertia in an unlocked state when the panel is removed from a main body and thereby breakdown or damage of the panel caused by dropping of the panel is prevented.

There is an in-vehicle electronic apparatus which is installed inside of a vehicle and is used as, for example, a music recording and reproducing device, an image display device, or the like.

Such an in-vehicle electronic apparatus has a type of in-vehicle electronic apparatus in which a main body and a panel including a display unit or the like are provided, the panel is attachable to and detachable from the main body, and the panel is removed from the main body when not used (for example, refer to Japanese Unexamined Patent Application Publication No. 9-251766). The panel is removed from the main body when not used, and thereby it is possible to prevent the in-vehicle electronic apparatus from being stolen.

In an in-vehicle electronic apparatus disclosed in Japanese Unexamined Patent Application Publication No. 9-251766, a panel is locked to a main body by a lock mechanism when the panel is installed in the main body, and then the panel can be removed from the main body by operating an operation part provided on the panel such that the locking by the lock mechanism is released.

SUMMARY

However, in the in-vehicle electronic apparatus disclosed in Japanese Unexamined Patent Application Publication No. 9-251766, the locking by the lock mechanism is released when the operation part is operated, and thus the panel can be removed from the main body.

Therefore, when the operation part is operated, if a user does not grasp the panel or unstably grasp the panel, then the panel is dropped by mistake, and thus there is concern that the panel may be damaged or broken down.

Thus, an embodiment of the present technology provides an in-vehicle electronic apparatus capable of solving the above-described problems and preventing breakdown or damage caused by dropping of a panel.

Firstly, it is preferable that an in-vehicle electronic apparatus may include a main body that includes a panel attaching/detaching part, and a panel that is attached to and detached from the panel attaching/detaching part. The panel attaching/detaching part may be provided with a lock mechanism and a holding lever, the lock mechanism being arranged to lock the panel to the main body, the holding lever being rotatable and being arranged to hold the panel when the holding lever is rotated to a holding position. The panel may be moved in a predetermined direction with respect to the main body such that locking of the panel to the main body by the lock mechanism is released. And when the panel is moved in the predetermined direction such that the locking of the panel to the main body by the lock mechanism is released, the holding lever may be rotated to the holding position due to inertia such that the panel is held by the holding lever.

Therefore, according to the in-vehicle electronic apparatus, when locking of the panel to the main body is released, the panel is held by the holding lever.

Secondly, it is preferable that the holding lever may be provided with a weight part having a fixed weight, and the holding lever which is rotated to the holding position due to inertia may be rotated to a release position where holding of the panel is released by a self-weight of the weight part.

The holding lever is provided with a weight part having a fixed weight, and the holding lever which is rotated to the holding position due to inertia is rotated to a release position where holding of the panel is released by the self-weight of the weight part. Thereby, it is not necessary to provide a release mechanism which releases a state in which the panel is held by the holding lever.

Thirdly it is preferable that the in-vehicle electronic apparatus may further include a support member that supports the holding lever in a manner that the holding lever is freely rotatable. The support member may be provided with a stopper part which stops the holding lever at the release position.

The support member is provided which supports the holding lever so as to be freely rotatable, and the support member is provided with a stopper part which stops the holding lever at the release position. Thereby, a rotating range of the holding lever becomes the minimum.

Fourthly, it is preferable that the holding lever may be provided with an extension part which has a holding part engaged with the panel and extends in a predetermined direction. And the extension part and the weight part may be provided so as to be substantially perpendicular to each other.

An extension part which has a holding part to be engaged with the panel and extends in a predetermined direction is provided in the holding lever, and the extension part and the weight part are provided so as to be substantially perpendicular to each other. Thereby, a space for the holding lever is reduced.

Fifthly, it is preferable that the in-vehicle electronic apparatus may further include a support member that supports the holding lever in a manner that the holding lever is freely rotatable, and a support lever that supports the panel when the locking of the panel to the main body by the lock mechanism is released. The support lever may be supported by the support member in a manner that the support lever is freely moved.

The support member is provided which supports the holding lever so as to be freely rotatable, the support lever is provided which supports the panel when locking of the panel to the main body by the lock mechanism is released, and the support lever is supported by the support member so as to be freely moved. Thereby, a separate member for supporting the holding lever and the support lever is not necessary.

According to an embodiment of the present technology, there is provided an in-vehicle electronic apparatus including a main body that includes a panel attaching/detaching part, and a panel that is attached to and detached from the panel attaching/detaching part. The panel attaching/detaching part may be provided with a lock mechanism and a holding lever, the lock mechanism being arranged to lock the panel to the main body, the holding lever being rotatable and being arranged to hold the panel when the holding lever is rotated to a holding position. The panel may be moved in a predetermined direction with respect to the main body such that the locking of the panel to the main body by the lock mechanism is released. And when the panel is moved in the predetermined direction such that locking of the panel to the main body by the lock mechanism is released, the holding lever may be rotated to the holding position due to inertia such that the panel is held by the holding lever.

Therefore, since the panel is held by the holding lever in a state in which the panel is unlocked from the main body, the panel is rarely dropped by mistake, and thus it is possible to prevent breakdown or damage of the panel.

According to an embodiment of the present technology, the holding lever may be provided with a weight part having a fixed weight. And the holding lever which is rotated to the holding position due to inertia may be rotated to a release position where holding of the panel is released by a self-weight of the weight part.

Therefore, a release mechanism which releases a state in which the panel is held by the holding lever is not necessary to be provided, and, accordingly, it is possible to achieve reduction in the number of components and simplification of a mechanism of the in-vehicle electronic apparatus.

According to an embodiment of the present technology, the in-vehicle electronic apparatus may further include a support member that supports the holding lever in a manner that the holding lever is freely rotatable. The support member may be provided with a stopper part which stops the holding lever at the release position.

Therefore, a rotating range of the holding lever becomes the minimum, and, accordingly, it is possible to reduce a space for the holding lever and to minimize the in-vehicle electronic apparatus.

According to an embodiment of the present technology, the holding lever may be provided with an extension part which has a holding part engaged with the panel and extends in a predetermined direction. And the extension part and the weight part may be provided so as to be substantially perpendicular to each other.

Therefore, it is possible to reduce a space for the holding lever, and it is possible to further minimize the in-vehicle electronic apparatus.

According to an embodiment of the present technology, the in-vehicle electronic apparatus may further include a support member that supports the holding lever in a manner that the holding lever is freely rotatable, and a support lever that supports the panel when the locking of the panel to the main body by the lock mechanism is released. The support lever may be supported by the support member in a manner that the support lever is freely moved.

Therefore, a separate member for supporting the holding lever and the support lever is not necessary, and thus it is possible to achieve miniaturization through reduction in the number of components.

BRIEF DESCRIPTION OF THE DRAWINGS

FIG. 17 is a schematic cross-sectional view illustrating an intermediate state in which supporting of the panel by a support lever is released; and FIG. 18 is a schematic cross-sectional view illustrating a state in which supporting of the panel by the support lever is released.

DETAILED DESCRIPTION OF THE EMBODIMENT(S)

Figure 1:
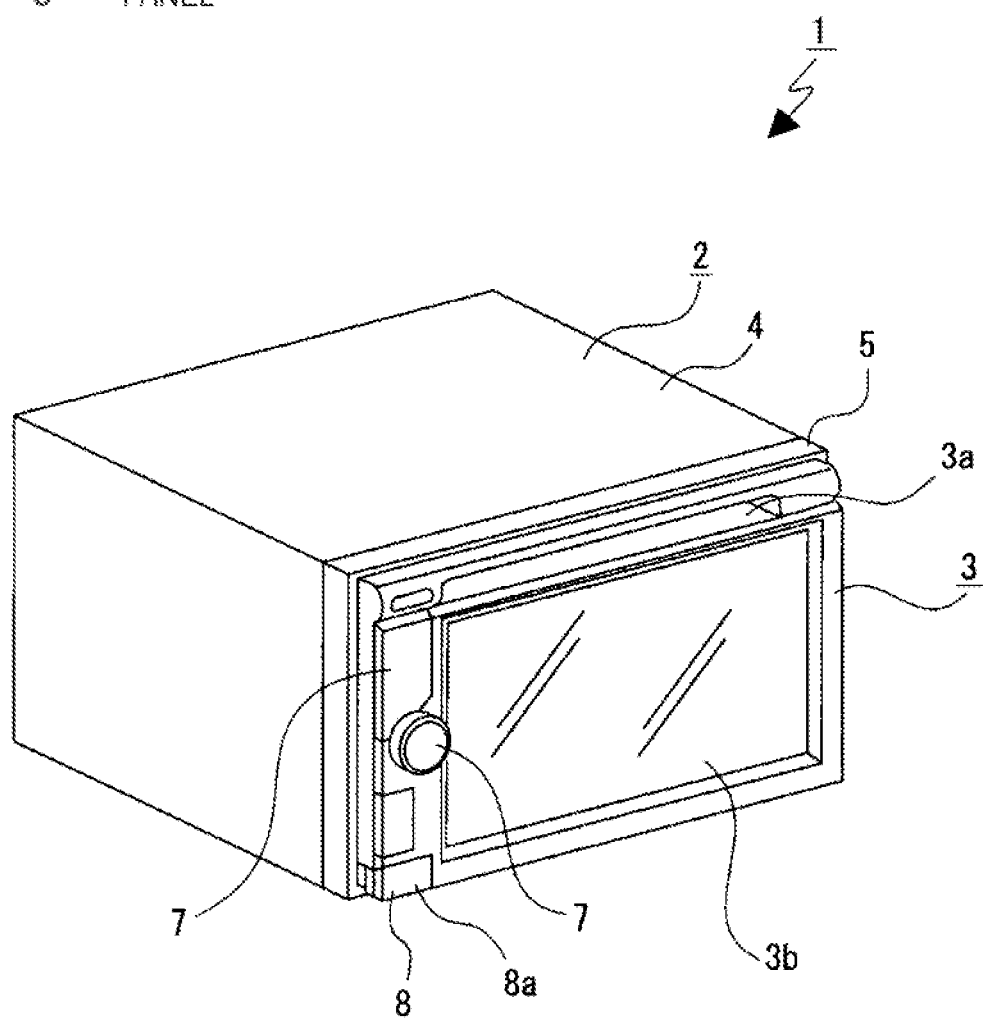
FIG. 1 is a diagram illustrating an in-vehicle electronic apparatus according to an embodiment of the present technology along with FIGS. 2 to 18, and is a perspective view of the in-vehicle electronic apparatus.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, the best mode for implementing an in-vehicle electronic apparatus according to an embodiment of the present technology will be described with reference to the accompanying drawings.

The best mode described below is to apply an in-vehicle electronic apparatus according to the embodiment of the present technology to an in-vehicle electronic apparatus used as a disc reproducing device which outputs (reproduces) music data recorded on a disc-like recording medium.

However, an application scope of the embodiment of the present technology is not limited to the in-vehicle electronic apparatus used as a disc reproducing device. The in-vehicle electronic apparatus according to the embodiment of the present technology may be widely applied to a recording and reproducing device which records and reproduces data on and from a recording medium such as a memory card other than the disc-like recording medium, or a variety of in-vehicle electronic apparatuses in which a panel is attachable to and detachable from a main body such as a display device which displays images or video on the panel.

[Schematic Configuration of In-Vehicle Electronic Apparatus]

First, a schematic configuration of an in-vehicle electronic apparatus 1 will be described (refer to FIGS. 1 to 4).

The in-vehicle electronic apparatus 1 includes a main body 2 and a panel 3 which is attachable to and detachable from the main body 2.

The main body 2 at least includes a casing 4 with a box shape which is opened forward, and a front board 5 installed on the front face of the casing 4.

A disc reproducing device (not shown) which reproduces music data or the like recorded on a disc-like recording medium such as an optical disk or a magnetic disk is disposed within the casing 4.

A transversely long disc insertion hole 5a is formed at the upper end of the front board 5.

A recessed portion 5b which is opened forward is formed in a portion other than the upper portion of the front board 5. The front board 5A includes a terminal disposition hole 5c formed in the recessed portion 5b, and a connection terminal (not shown) is disposed in the terminal disposition hole 5c.

Hinge shafts 5d and 5e are provided at the right end of the front board 5 so as to be spaced apart from each other vertically, and specifically the hinge shaft 5d is projected downward and the hinge shaft 5e is projected upward. Positioning protrusions 5f and 5f which are projected to the left are provided so as to be spaced apart from each other vertically between the hinge shafts 5d and 5e at the right end of the front board 5. The positioning protrusions 5f and 5f are located at the recessed portion 5b. An insertion through-hole 5g which is longitudinally long is formed at a position around the left end of the front board 5 (refer to FIG. 3).

A panel attaching/detaching part 6 is supported at the left end of the front board 5 in a state in which a portion thereof is inserted into the insertion through-hole 5g. Details of the panel attaching/detaching part 6 will be described later.

Figure 4:
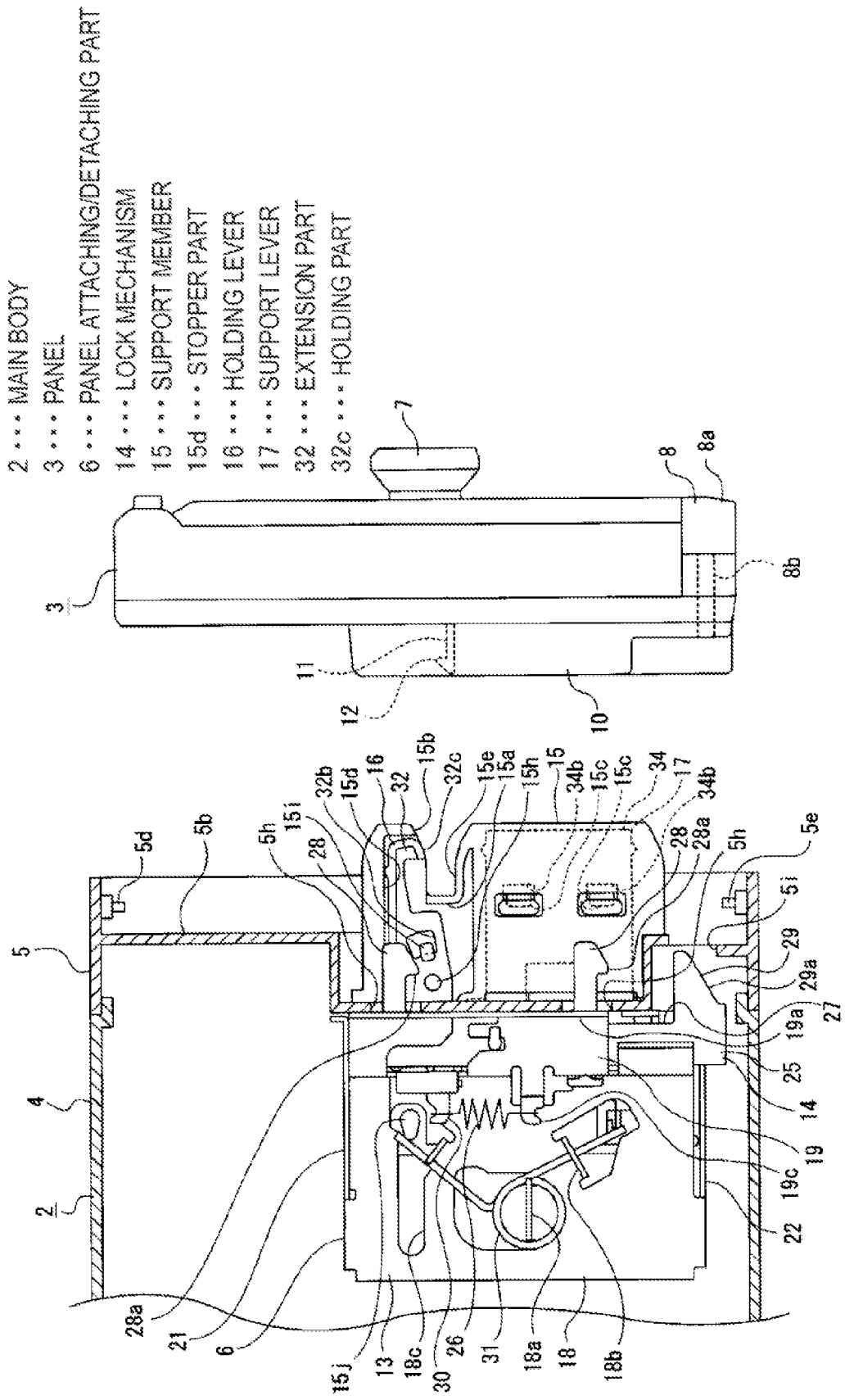
FIG. 4 is an enlarged side view illustrating a state in which the panel is removed from the main body by using a partial cross-sectional view.

Protrusion through-holes 5h and 5h are formed at the left end of the front board 5 so as to be spaced apart from each other vertically, and a pin through-hole 5i is formed on the lower side of the protrusion through-holes 5h and 5h (refer to FIG. 4).

Figure 2:
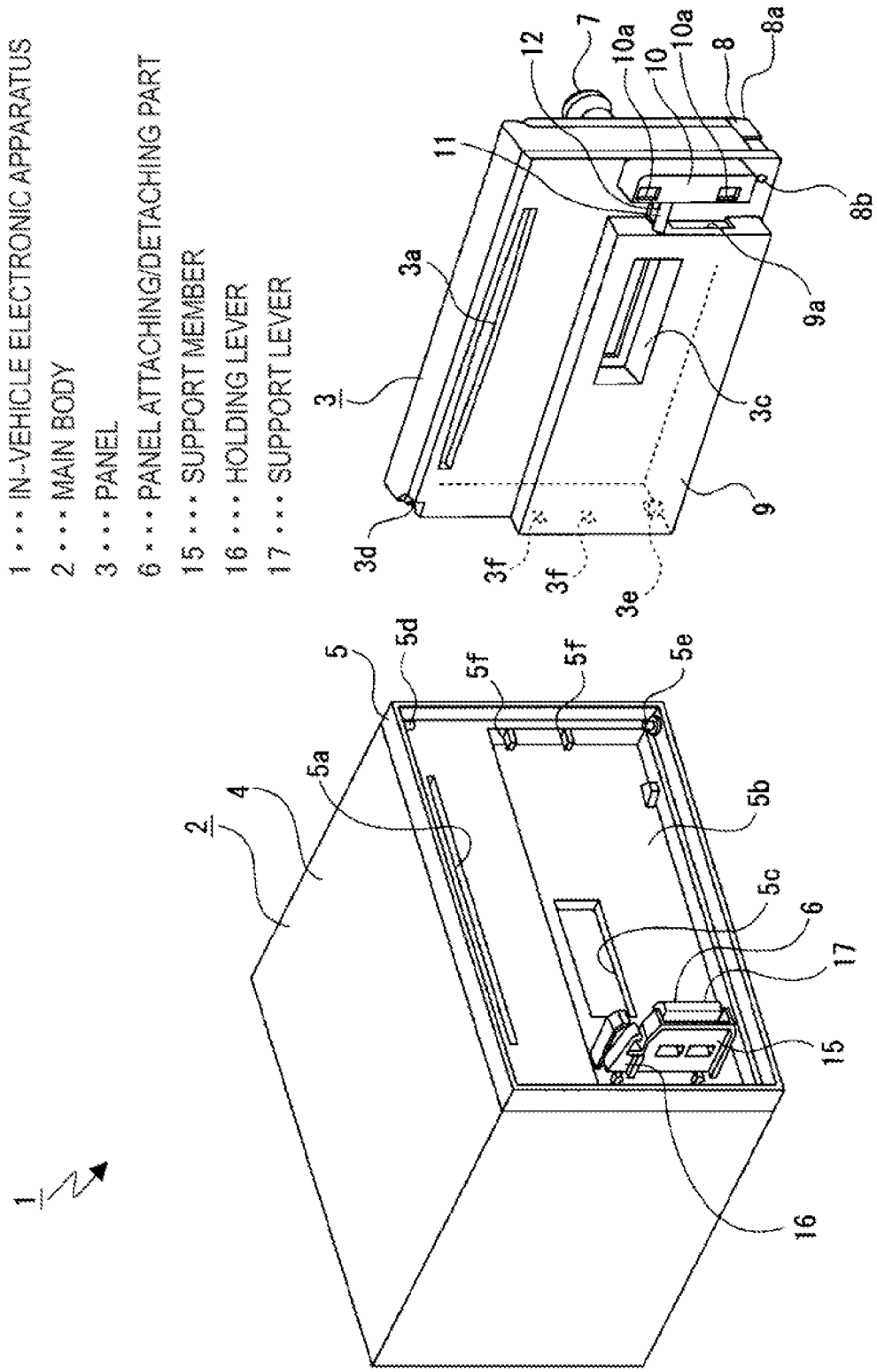
FIG. 2 is a perspective view of the in-vehicle electronic apparatus illustrating a state in which a panel is removed from a main body.

A transversely long disc insertion hole 3a is formed at the upper end of the panel 3 (refer to FIGS. 1 and 2). In the panel 3, a display unit (display panel) 3b is provided on the lower front side of the disc insertion hole 3a (refer to FIG. 1).

The display unit 3b also functions as, for example, a touch panel. Predetermined processes such as outputting (reproducing) music data or the like recorded on a disc-like recording medium or selecting music data or the like can be performed by operating the display unit 3b with the finger or the like.

The panel 3 is provided with a connector disposition hole 3c (refer to FIG. 2), and a connector (not shown) is disposed on the rear end side in the connector disposition hole 3c. The connector is connected to the display unit 3b.

Operation parts 7 and 7 are provided on the front side at the left end of the panel 3, and, for example, a power button or a mode switching button is provided as the operation parts 7 and 7.

An unlock button 8 is provided at the lower and left end of the panel 3 (refer to FIGS. 1, 2 and 4). The unlock button 8 can move in the front-back direction and is biased forward by a spring (not shown). The unlock button 8 includes an operated part 8a and a pushing shaft 8b which is projected backward from the operated part 8a, and the pushing shaft 8b is projected backward from the panel 3 when the operated part 8a is pushed.

Bearing recessed portions 3d and 3e which are spaced apart from each other vertically are formed at the right end on the rear side of the panel 3 (refer to FIG. 2). The bearing recessed portion 3d located on the upper side is opened upward and to the right, and the bearing recessed portion 3e located on the lower side is opened downward and to the right. Positioning recessed portions 3f and 3f which are opened to the right are formed at the right end of the panel 3 between the bearing recessed portions 3d and 3e so as to be spaced apart from each other vertically.

A projection 9 which is projected backward is provided in a portion other than the upper portion on the rear side of the panel 3. The projection 9 is provided in a portion other than the left end portion of the panel 3. An engaging recessed portion 9a is formed on the left surface of the projection 9.

A longitudinally long protrusion 10 which is projected backward is provided at the left end on the rear side of the panel 3, and locked recessed portions 10a and 10a which are opened backward are formed in the protrusion 10 so as to be spaced apart from each other vertically.

Figure 3:
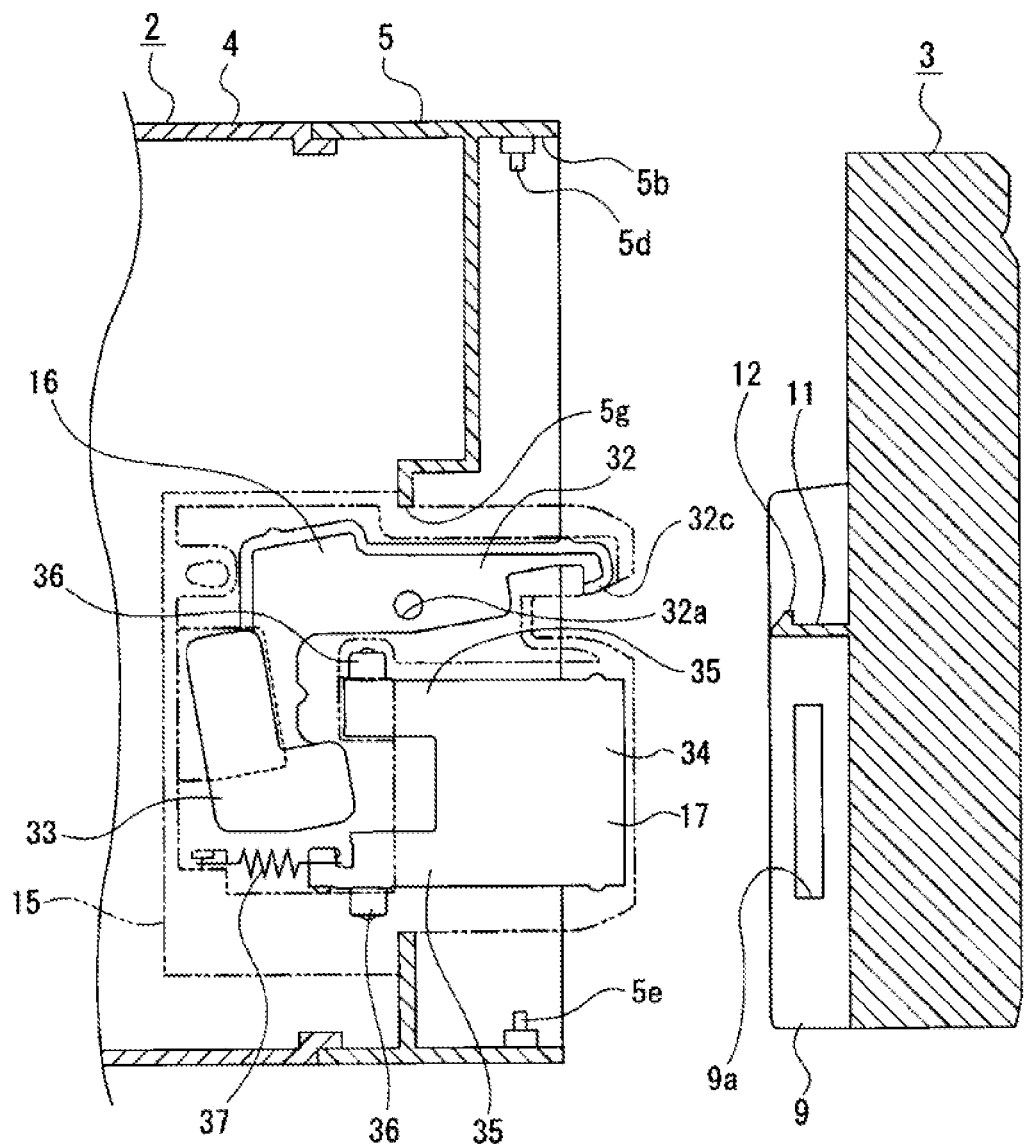
FIG. 3 is an enlarged cross-sectional view illustrating a state in which the panel is removed from the main body.

A holding engagement part 11 which is projected backward is provided between the projection 9 and the protrusion 10 (refer to FIGS. 2 to 4). An engaging protrusion 12 which is projected upward is provided at the rear end of the holding engagement part 11.

[Detailed Configuration of Panel Attaching/Detaching Part]

Figure 5:
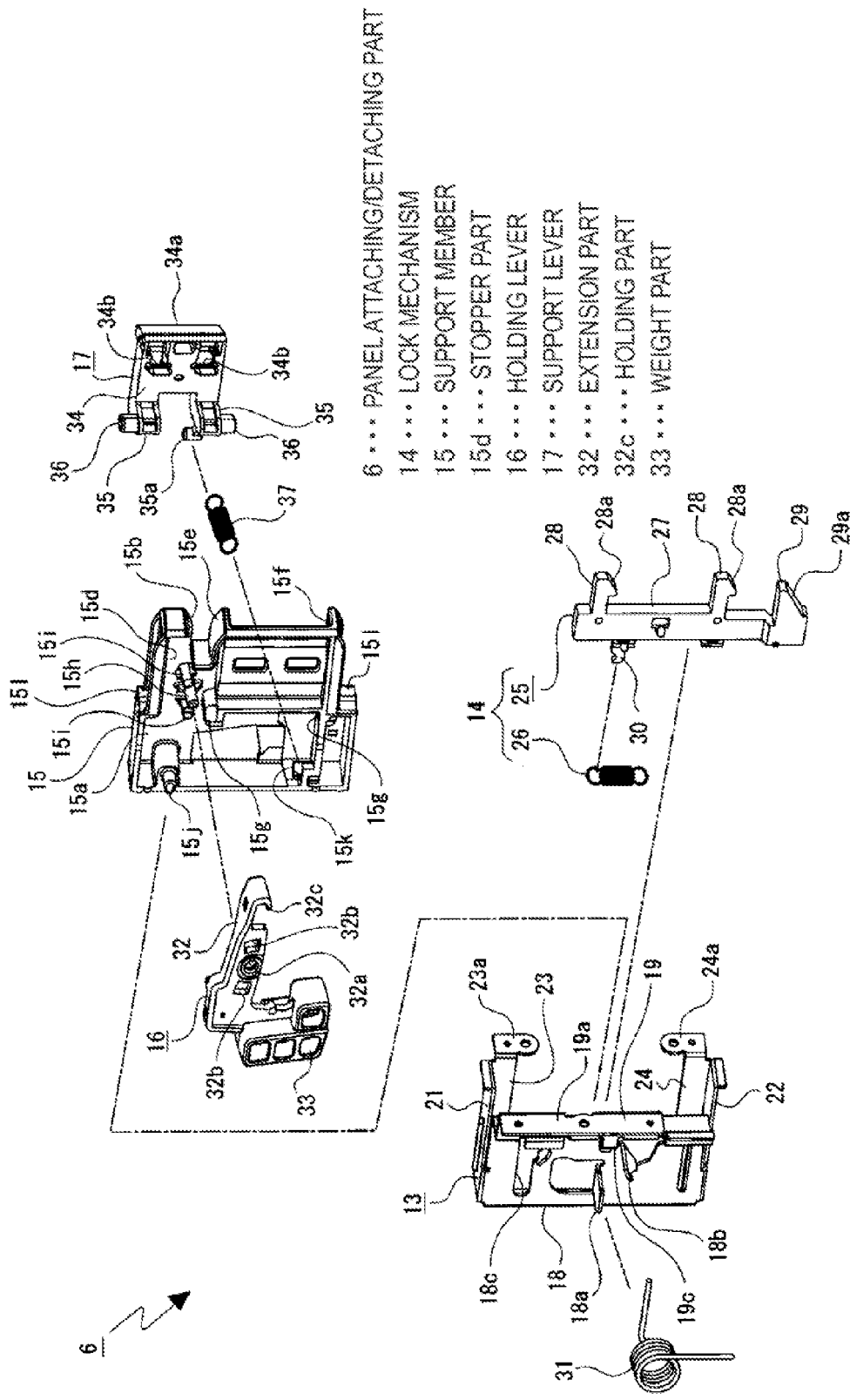
FIG. 5 is an exploded perspective view of a panel attaching/detaching part.
Figure 6:
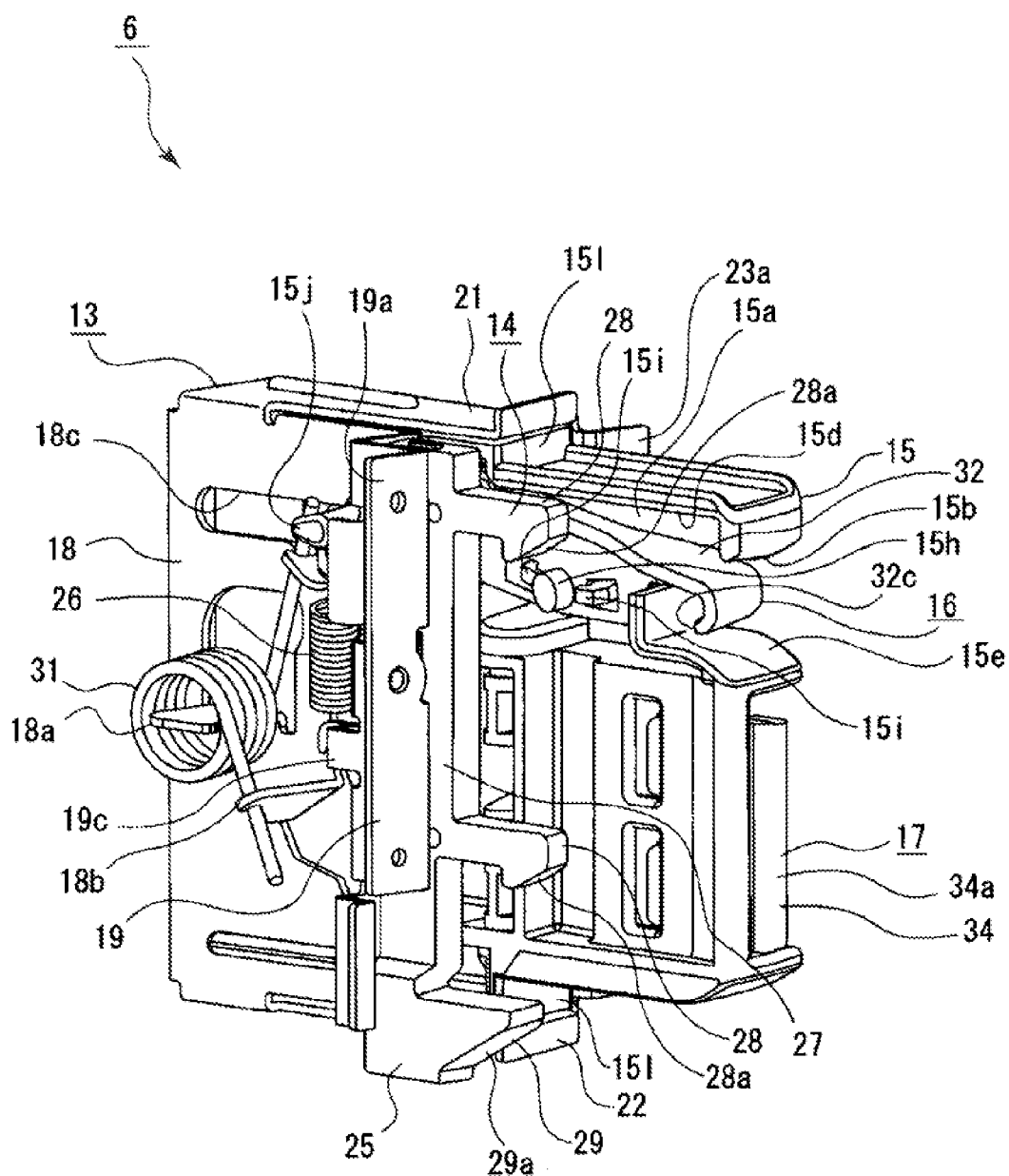
FIG. 6 is an enlarged perspective view of the panel attaching/detaching part.
Figure 7:
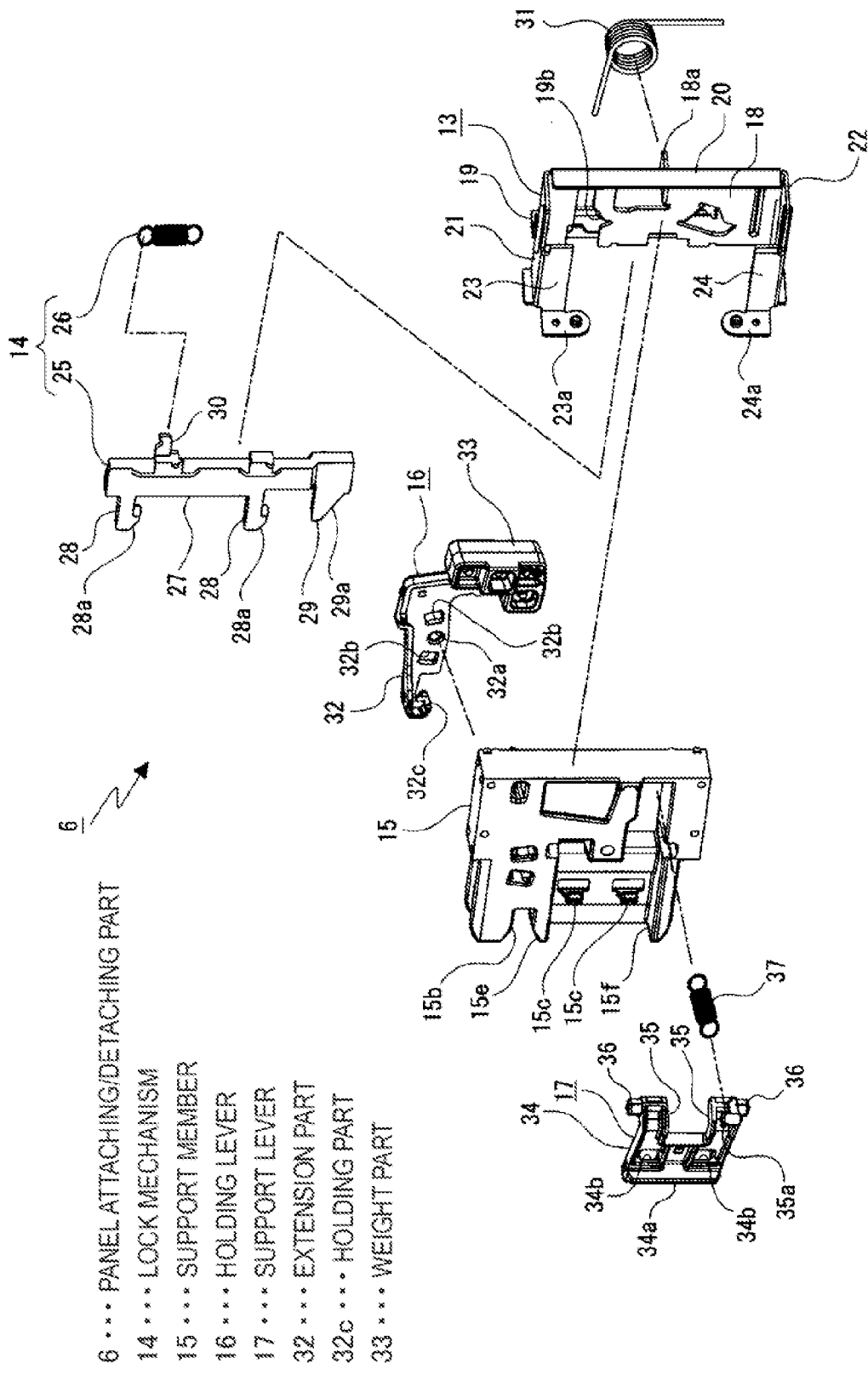
FIG. 7 is an exploded perspective view of the panel attaching/detaching part when viewed from a direction different from FIG. 5.

Next, a detailed configuration of the panel attaching/detaching part 6 will be described (refer to FIGS. 5 to 7).

The panel attaching/detaching part 6 includes a support case 13, a lock mechanism 14, a support member 15, a holding lever 16, and a support lever 17.

The support case 13 includes a base surface part 18 which faces in a horizontal direction, a support surface part 19 which is subsequent to the front end of the base surface part 18 and is curved in a crank shape, a receiving surface part 20 which is projected to the right from the rear end of the base surface part 18, an upper surface part 21 and a lower surface part 22 which are respectively subsequent to both upper and lower ends of the base surface part 18, and pressing surface parts 23 and 24 which are respectively projected from the right ends of the upper surface part 21 and the lower surface part 22. The pressing surface part 23 is projected downward from the right end of the upper surface part 21, and the pressing surface part 24 is projected upward from the right end of the lower surface part 22.

The base surface part 18 is provided with a spring support section 18a and a spring hook section 18b which are projected to the left, respectively. The spring hook section 18b is located on the lower side of the spring support section 18a. A support hole 18c which extends back and forth is formed at a position around the upper end of the base surface part 18.

An installation surface section 19a which faces in the front-back direction is provided at the front end of the support surface part 19. An insertion hole 19b which penetrates back and forth is formed at a position around the upper end of the support surface part 19. The support surface part 19 is provided with a spring hook protrusion 19c which is projected backward on the lower side of the insertion hole 19b.

Installation surface sections 23a and 24a which face in the front-back direction are respectively provided at the front ends of the pressing surface parts 23 and 24.

The support case 13 is installed on the rear side of the front board 5 by fastening the installation surface sections 19a, 23a and 24a with screws or the like, and is located so as to surround the insertion through-hole 5g formed in the front board 5.

The lock mechanism 14 includes a lock slider 25 and an extension coil spring 26.

The lock slider 25 includes a base 27 which extends vertically, lock protrusions 28 and 28 which are projected forward from the base 27 and are spaced apart from each other vertically, an unlock protrusion 29 which is projected forward from the lower end of the base 27, and a spring support protrusion 30 which is projected backward from the base 27.

An engaging claw 28a which is projected downward is provided at the tip end of the lock protrusion 28.

A sliding inclined surface 29a which is displaced downward toward the rear side is formed at the tip end of the unlock protrusion 29.

The lock slider 25 is supported at the support surface part 19 of the support case 13 so as to be freely moved vertically. In a state in which the lock slider 25 is supported at the support surface part 19, the spring support protrusion 30 is projected backward from the insertion hole 19b, and the extension coil spring 26 is supported between the spring support protrusion 30 and the spring hook protrusion 19c of the support case 13. Therefore, the lock slider 25 is biased downward by the extension coil spring 26, and is located at a lower movable end in a state in which an upward movement force is not applied thereto.

The support member 15 is supported so as to be freely moved (be freely slid) in the front-back direction in a state in which a portion thereof is inserted into the support case 13.

The support member 15 is provided with a recessed portion 15a which is opened to the left approximately on the whole. An opening 15b which is opened forward is formed at the front end of the support member 15. Restricting protrusions 15c and 15c which are projected to the right are provided on the lower side of the opening 15b at the front end of the support member 15 so as to be spaced apart from each other vertically.

A stopper part 15d which faces downward is provided on the upper side of the opening 15b in the support member 15. A lower surface which forms the opening 15b of the support member 15 is provided as a guide surface 15e which is gently inclined downward toward the front side.

A recessed lever support part 15f which is opened to the right is formed on the lower side of the opening 15b in the support member 15. Bearing parts 15g and 15g are provided on the rear side of the lever support part 15f so as to be spaced apart from each other vertically in the support member 15.

A support shaft 15h which is projected to the left is provided at the upper end of the recessed portion 15a of the support member 15, and inserting protrusions 15i and 15i which are projected to the left are respectively provided on the front and rear sides of the support shaft 15h.

A spring engagement part 15j which is projected to the left is provided on the rear side of the rear inserting protrusions 15i in the support member 15. A spring engagement protrusion 15k which is projected backward is provided at the rear end of the support member 15, and the spring engagement protrusion 15k is located on the lower side of the spring engagement part 15j.

The support member 15 is provided with movement restricting step faces 15l and 15l which face forward at the upper end and the lower end, respectively, and the movement restricting step faces 15l and 15l are located substantially at the center in the front-back direction.

In a state in which the support member 15 is supported at the support case 13, the spring engagement part 15j is projected to the left from the support hole 18c of the support case 13.

In a state in which the support member 15 is supported at the support case 13, a torsion coil spring 31 is supported at the spring support section 18a of the support case 13, and both ends of the torsion coil spring 31 are respectively engaged with the spring hook section 18b of the support case 13 and the spring engagement part 15j of the support member 15. Therefore, the support member 15 is biased forward by the torsion coil spring 31. In a state in which a backward movement force is not applied to the support member 15, the movement restricting step faces 15l and 15l are pressed to the rear opening edge of the insertion through-hole 5g of the front board 5 by a biasing force of the torsion coil spring 31, and thereby the support member 15 is located at a front movable end.

The holding lever 16 includes an extension part 32 which substantially extends in the front-back direction and a weight part 33 which is projected approximately downward from the rear end of the extension part 32, and is formed substantially in an L shape on the whole.

A shaft through-hole 32a which horizontally penetrates is formed approximately at the center of the extension part 32 in the front-back direction. Inserted holes 32b and 32b are formed on the front and rear sides of the shaft through-hole 32a in the extension part 32. A holding part 32c which is projected substantially downward is provided at the front end of the extension part 32.

The support shaft 15h of the support member 15 is inserted into the shaft through-hole 32a, and thus the holding lever 16 is supported by the support member 15 so that it is freely rotatable with respect to the support shaft 15h used as a fulcrum. The inserting protrusions 15i and 15i of the support member 15 are respectively inserted into the inserted holes 32b and 32b of the holding lever 16.

The holding lever 16 is rotated in a direction in which the holding part 32c is moved approximately vertically, and thus the holding lever 16 is rotated between a release position where the holding part 32c is located at an upper turning end and a holding position where the holding part 32c is located at a lower turning end.

In a state in which the holding lever 16 is supported by the support member 15, a turning force in which the holding part 32c is moved approximately upward by the weight of the weight part 33 is generated, and thus the holding part 32c comes into contact with the stopper part 15d of the support member 15 and is stopped at the release position.

The support lever 17 includes a driving surface part 34 which faces approximately horizontally, arm parts 35 and 35 which are respectively projected approximately to the side from both upper and lower ends at the rear end of the driving surface part 34, and shafts 36 and 36 which are respectively projected upward and downward from the rear ends of the arm parts 35 and 35.

An engagement regulating section 34a which is formed approximately in a protruding wedge shape is provided to the right at the front end of the driving surface part 34. Engagement holes 34b and 34b which are spaced apart from each other vertically are formed at a position around the front end of the driving surface part 34.

A spring support piece 35a which is projected backward is provided in the lower arm part 35.

The shafts 36 and 36 are respectively inserted into the bearing parts 15g and 15g of the support member 15, and thus the support lever 17 is supported by the support member 15 so that it freely rotatable with respect to the shafts 36 and 36 used as fulcrums.

In a state in which the support lever 17 is supported by the support member 15, a spring member 37 which is an extension coil spring is supported between the spring engagement protrusion 15k of the support member 15 and the spring support piece 35a of the support lever 17. Therefore, the support lever 17 is biased in a turning direction in which the engagement regulating section 34a is moved approximately to the right by the spring member 37. In a state in which a turning force for moving the engagement regulating section 34a approximately to the left is not applied, the restricting protrusions 15c and 15c are engaged with the opening edges of the engagement holes 34b and 34b, and thereby the support lever 17 is located at the right turning end.

[Operation in In-Vehicle Electronic Apparatus]

Hereinafter, attaching and detaching operations of the panel 3 to and from the main body 2 in the in-vehicle electronic apparatus 1 will be described.

First, a description will be made of an initial state of each section of the panel attaching/detaching part 6 before the panel 3 is installed in the main body 2 (refer to FIGS. 3 and 4).

The lock slider 25 of the lock mechanism 14 is biased downward by the extension coil spring 26 and is located at the lower movable end in an initial state.

The support member 15 is biased forward by the torsion coil spring 31, and the movement restricting step faces 15l and 15l are pressed to the rear opening edge of the insertion through-hole 5g of the front board 5 and are located at the front movable end.

The holding part 32c is brought into contact with the stopper part 15d of the support member 15 by the weight of the weight part 33, and thus the holding lever 16 is stopped at the release position.

The engagement regulating section 34a is biased in a direction of being moved approximately to the right by the spring member 37, the restricting protrusions 15c and 15c of the support member 15 are respectively engaged with the opening edges of the engagement holes 34b and 34b, and the support lever 17 is located at the right turning end.

Next, a description will be made of an operation of each part when the panel 3 is attached to and detached from the main body 2 in the above-described initial state (refer to FIGS. 8 to 21).

Figure 8:
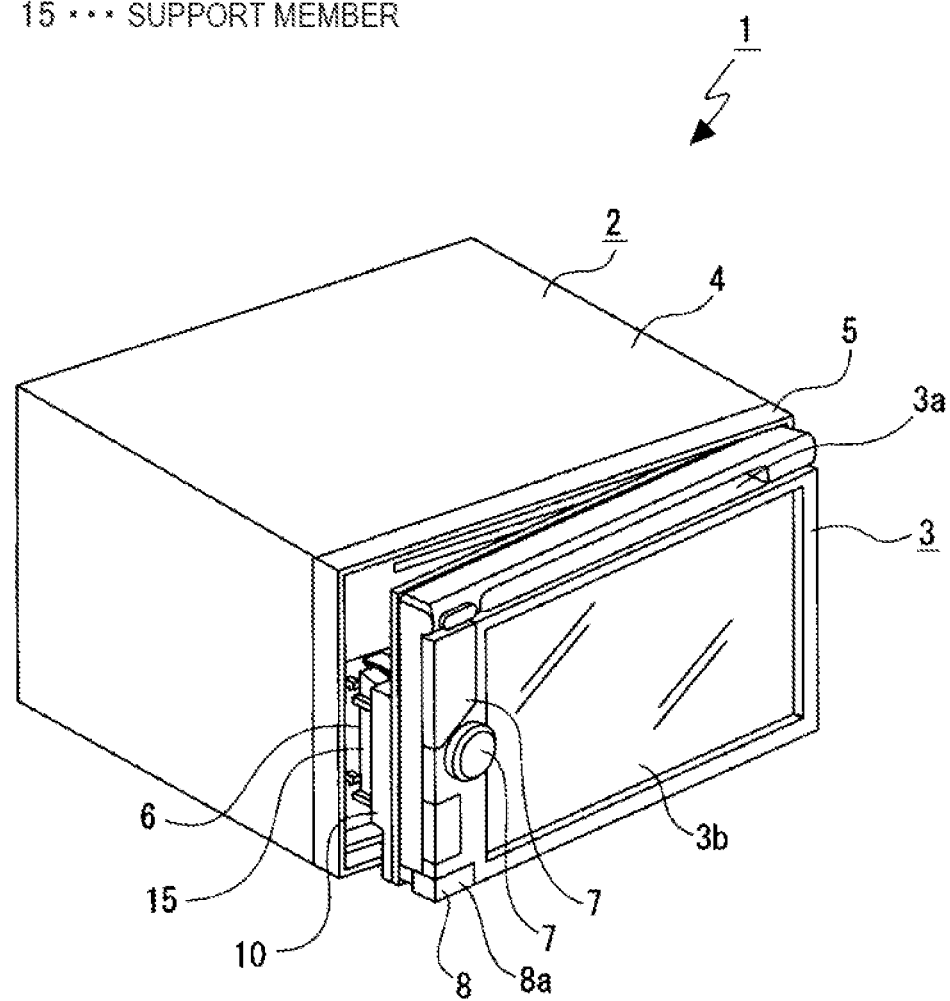
FIG. 8 is a diagram illustrating an operation when the panel is attached to and detached from the main body along with FIGS. 9 to 18, and is a perspective view illustrating a state before the panel is locked to the main body when the panel is installed in the main body.

When the panel 3 is installed in the main body 2, first, the panel 3 is assembled into the front board 5 such that the hinge shafts 5d and 5e of the front board 5 are respectively inserted into the bearing recessed portions 3d and 3e formed in the panel 3 (refer to FIG. 8). At this time, the positioning protrusions 5f and 5f of the front board 5 are respectively inserted into the positioning recessed portions 3f and 3f of the panel 3 such that positioning of the panel 3 is performed with respect to the main body 2.

Next, the panel 3 is rotated in a direction in which the left end thereof is moved backward with respect to the hinge shafts 5d and 5e used as fulcrums. When the panel 3 is rotated, the left surface of the projection 9 in the panel is slid to the engagement regulating section 34a of the support lever 17. The support lever 17 is rotated in a direction of being temporarily moved to the left against a biasing force of the spring member 37 and is then rotated in a direction of being moved to the right by the biasing force of the spring member 37, and the engagement regulating section 34a is engaged with the opening edge of the engaging recessed portion 9a. Therefore, the engagement regulating section 34a is engaged with the opening edge of the engaging recessed portion 9a, and thereby the panel 3 is supported by the support lever 17.

Figure 9:
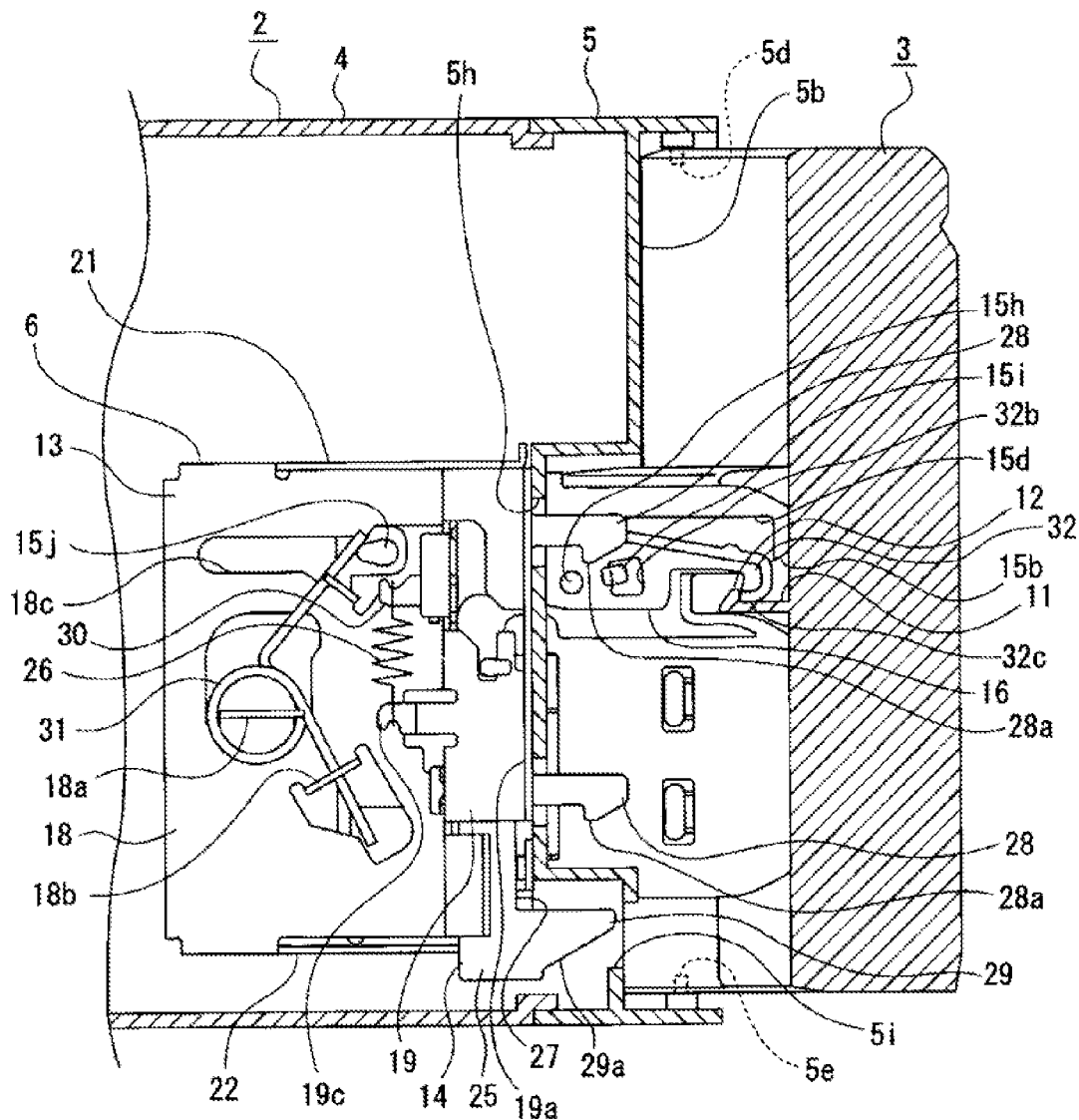
FIG. 9 is an enlarged cross-sectional view illustrating a state before the panel is locked to the main body when the panel is installed in the main body.

At the same time, the holding engagement part 11 of the panel 3 is inserted into the opening 15b of the support member 15 (refer to FIG. 9). At this time, the holding engagement part 11 is guided by the guide surface 15e of the support member 15 and is thus reliably inserted into the opening 15b.

Further, the panel 3 is rotated in a direction in which the left end thereof is moved backward with respect to the hinge shafts 5d and 5e used as fulcrums. If the panel 3 is further rotated, the support member 15 is pressed backward by the panel 3, and thus the support member 15 is moved backward against a biasing force of the torsion coil spring 31 along with the holding lever 16 and the support lever 17.

Figure 10:
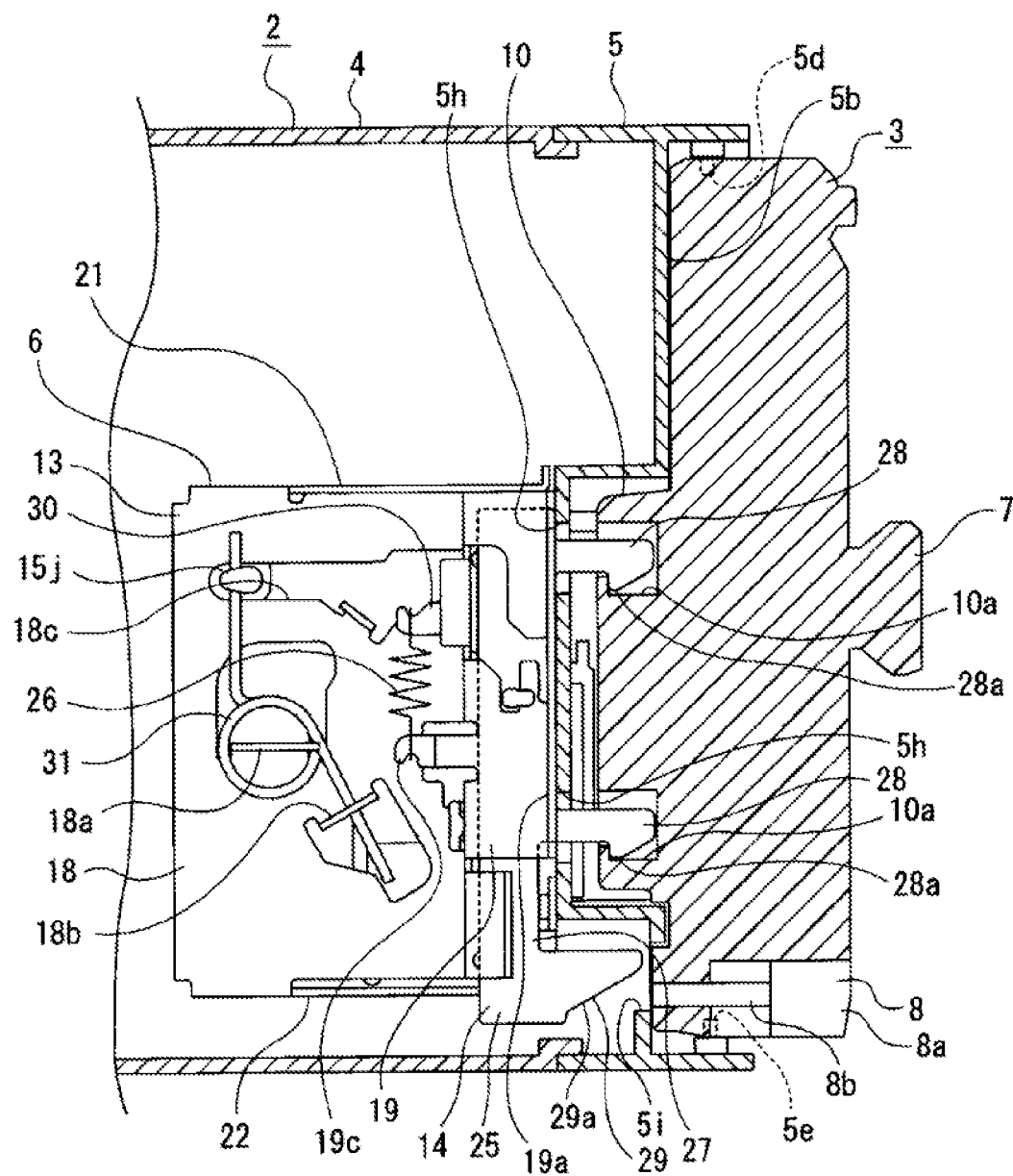
FIG. 10 is an enlarged cross-sectional view illustrating a state in which the panel is locked to the main body by a lock mechanism.
Figure 11:
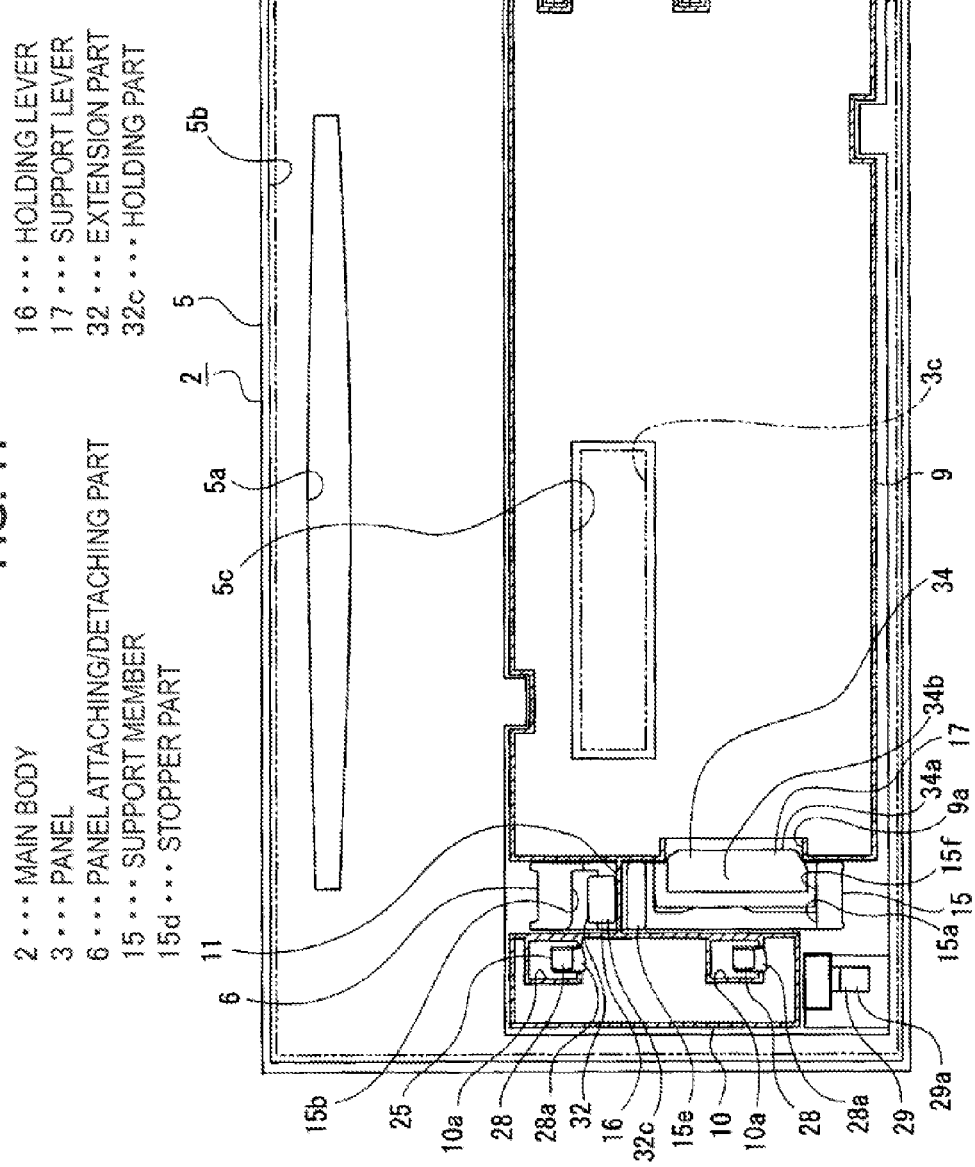
FIG. 11 is an enlarged front view illustrating a state in which the panel is locked to the main body by the lock mechanism by using a partial cross-sectional view.
Figure 12:
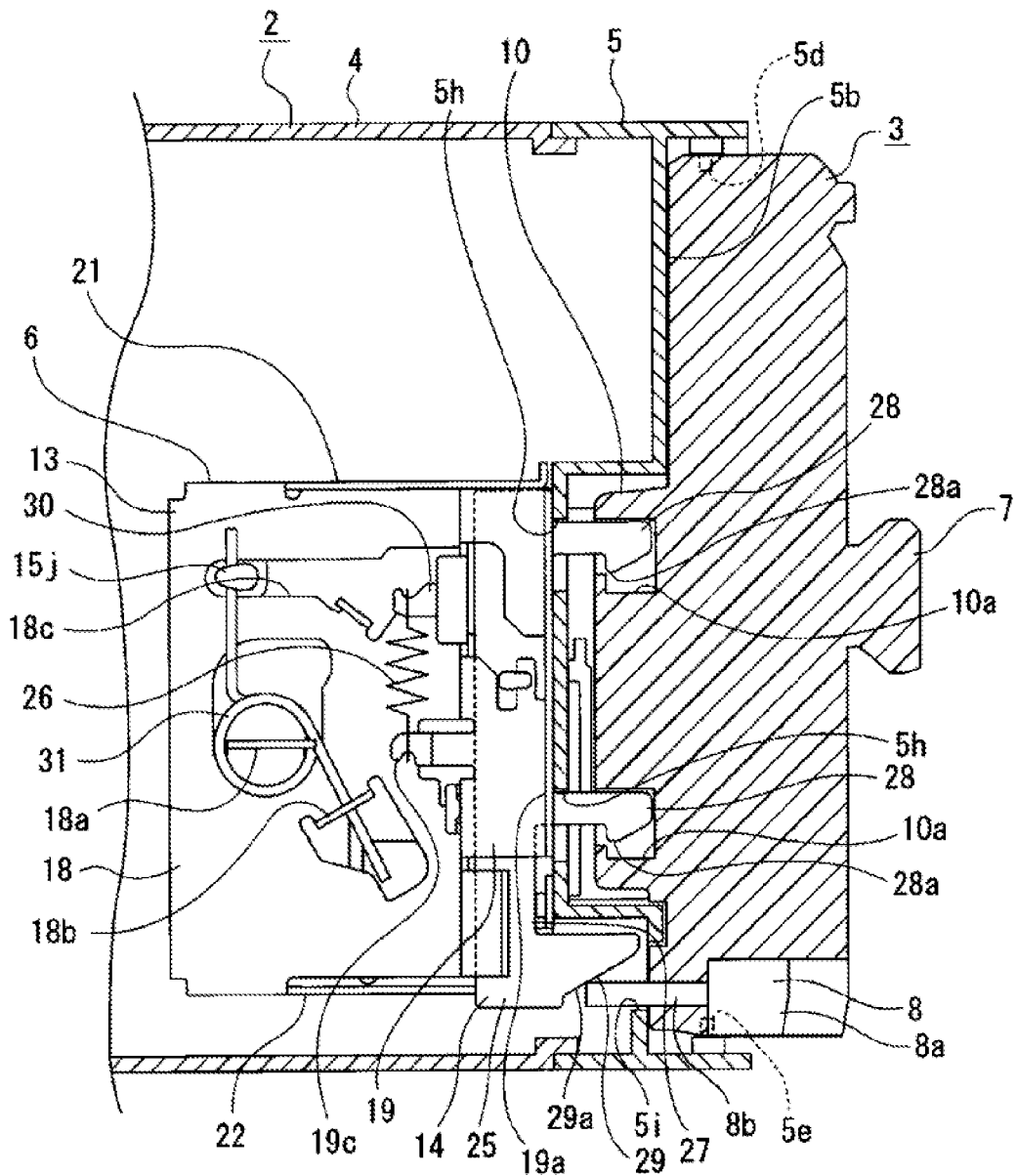
FIG. 12 is an enlarged cross-sectional view illustrating a state in which locking to the panel by the lock mechanism is released.
Figure 13:
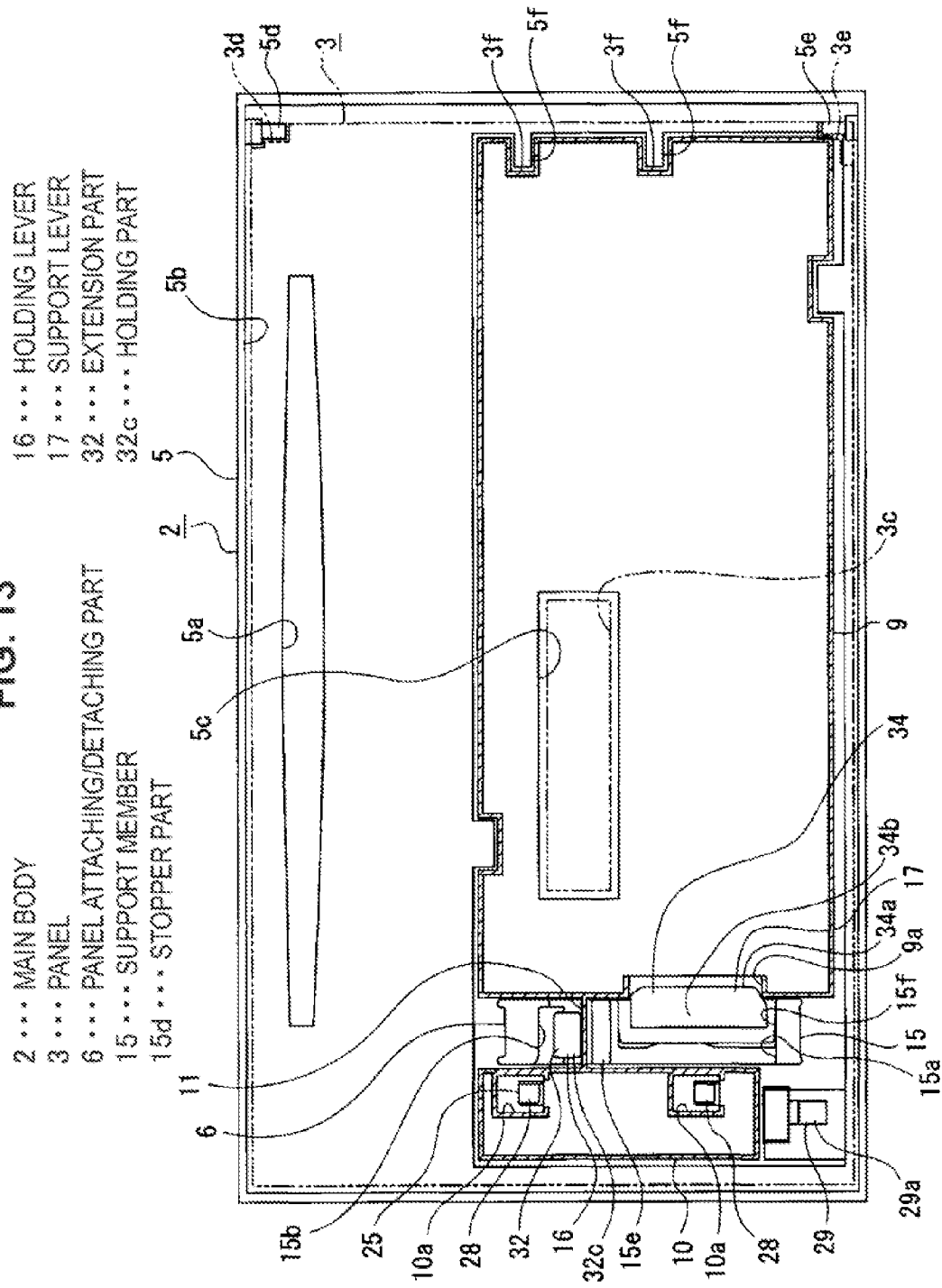
FIG. 13 is an enlarged front view illustrating a state in which locking to the panel by the lock mechanism is released by using a partial cross-sectional view.

At this time, the opening edges of the locked recessed portions 10a and 10a of the protrusion 10 of the panel 3 are respectively slid to the engaging claws 28a and 28a of the lock protrusions 28 and 28 in the lock slider 25, the lock slider 25 is moved upward against a biasing force of the extension coil spring 26, then the lock slider 25 is moved downward by the biasing force of the extension coil spring 26, and thus the engaging claws 28a and 28a are respectively engaged with the locked recessed portions 10a and 10a (refer to FIGS. 10 and 11). Therefore, the panel 3 is locked to the main body 2 by the lock slider 25 and is thus installed in the main body 2.

In a state in which the panel 3 is installed in the main body 2, the connection terminal disposed in the terminal disposition hole 5c formed in the front board 5 is connected to the connector disposed in the connector disposition hole 3c formed in the panel 3. Therefore, a signal can be transmitted and received between the main body 2 and the panel 3.

In a state in which the panel 3 is installed in the main body 2, when a disc-like recording medium is inserted into the disc insertion hole 3a formed in the panel 3, the disc-like recording medium is inserted into inside of the main body 2 from the disc insertion hole 5a formed in the front board 5 of the main body 2. The disc-like recording medium is loaded by a loading mechanism (not shown) provided inside the main body 2, and is installed in the disc reproducing device so as to be rotated and to output music data or the like.

When the panel 3 is removed from the main body 2 in a state in which the panel 3 is installed in the main body 2 as described above, first, the unlock button 8 of the panel 3 is pushed.

When the unlock button 8 is pushed, the sliding inclined surface 29a of the unlock protrusion 29 in the lock slider 25 is pushed by the pushing shaft 8b, and the sliding inclined surface 29a is slid to the pushing shaft 8b. The lock slider 25 is moved upward against a biasing force of the extension coil spring 26, engaging of the engaging claws 28a and 28a of the lock protrusions 28 and 28 with the locked recessed portions 10a and 10a is released, and locking of the panel 3 by the lock slider 25 is released (refer to FIGS. 12 and 13).

Figure 14:
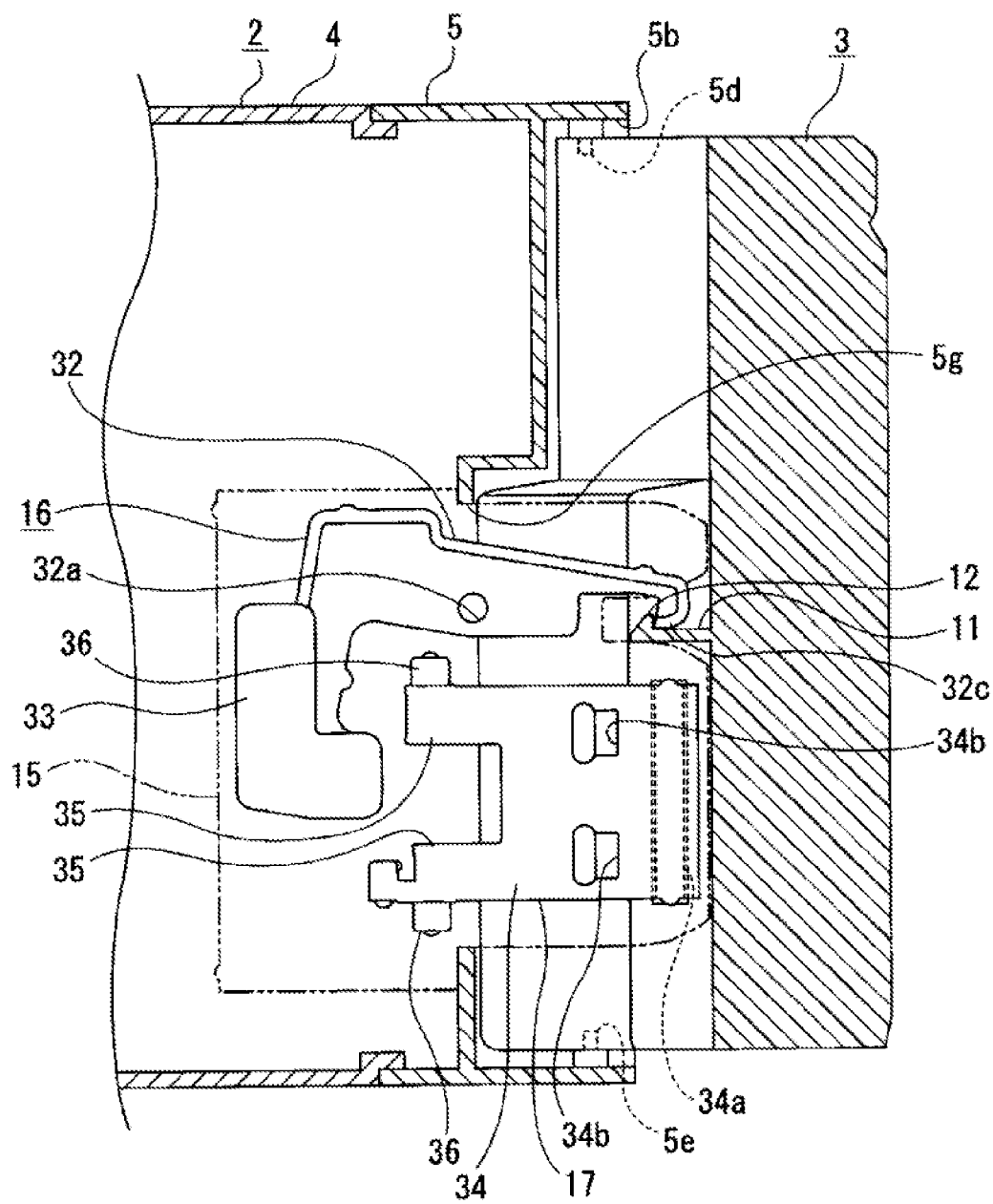
FIG. 14 is an enlarged cross-sectional view illustrating a state in which locking to the panel by the lock mechanism is released and the panel is held by a holding lever.
Figure 15:
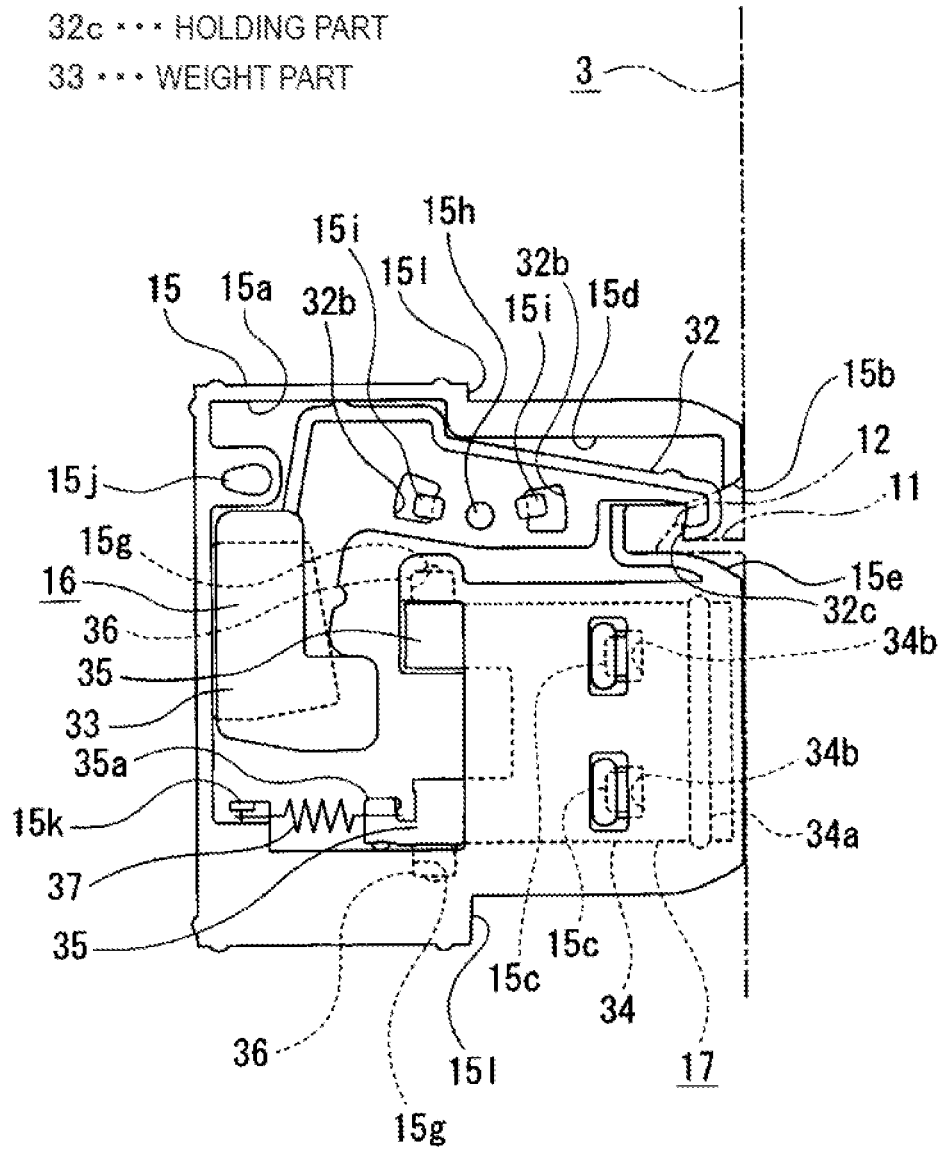
FIG. 15 is a schematic enlarged side view illustrating a state in which locking to the panel by the lock mechanism is released and the panel is held by the holding lever.

When locking of the panel 3 by the lock slider 25 is released, the support member 15 is moved forward by a biasing force of the torsion coil spring 31 along with the holding lever 16 and the support lever 17 (refer to FIGS. 14 and 15). The movement restricting step faces 15l and 15l are pressed to the rear opening edge of the insertion through-hole 5g of the front board 5, and thereby the support member 15 is located at the front movable end again and returns to an initial state.

When the support member 15 is located at the front movable end, and pushing to the unlock button 8 is released, the lock slider 25 is again moved to the lower movable end by a biasing force of the extension coil spring 26 and returns to an initial state.

When the support member 15 is moved forward by a biasing force of the torsion coil spring 31, a forward movement force is applied to the holding lever 16 which is supported by the support member 15. At this time, when the movement restricting step faces 15l and 15l are pressed to the rear opening edge of the insertion through-hole 5g and the support member 15 is stopped at the front movable end, the holding lever 16 is rotated in a direction in which the holding part 32c is moved downward due to inertia (refer to FIGS. 14 and 15). Therefore, the holding lever 16 is rotated to the holding position, the holding part 32c is engaged with the engaging protrusion 12 of the panel 3, and thereby the panel 3 is held by the holding lever 16.

Figure 16:
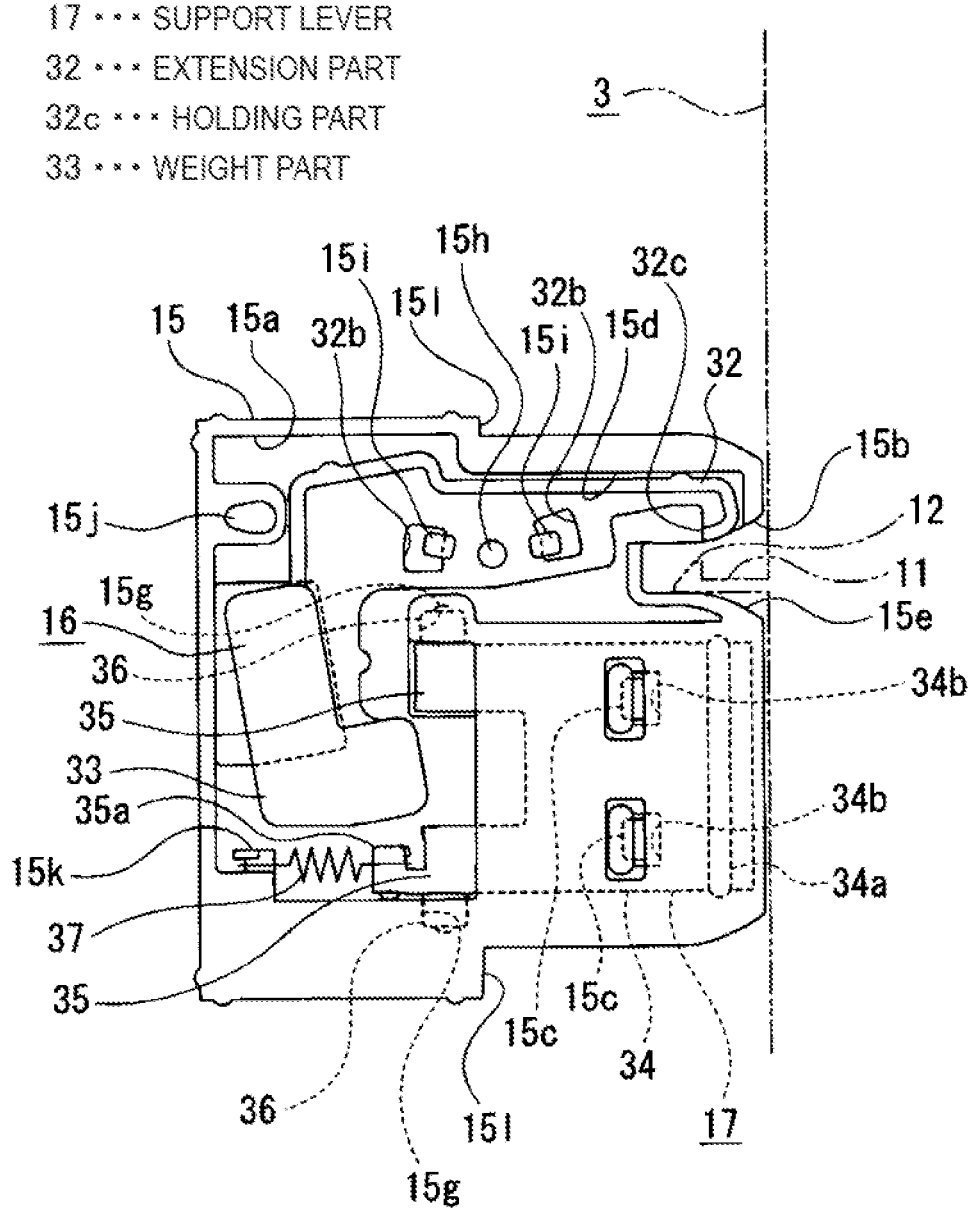
FIG. 16 is a schematic enlarged side view illustrating a state in which the holding lever is rotated to a release position by the self-weight and holding of the panel by the holding lever is released.

In this way, the holding lever 16 is temporarily rotated to the holding position due to inertia and holds the panel 3, and, immediately thereafter, is rotated from the holding position to the release position by the self-weight of the weight part 33 (refer to FIG. 16). Therefore, holding of the panel 3 by the holding lever 16 is released.

At this time, the panel 3 is supported by the support lever 17 because the engagement regulating section 34a of the support lever 17 is engaged with the opening edge of the engaging recessed portion 9a.

Successively, when the support state of the panel 3 by the support lever 17 is released and thereby the panel 3 is removed from the main body 2, the panel 3 is grasped and is rotated in a direction in which the left end thereof is moved forward with respect to the hinge shafts 5d and 5e which are fulcrums (refer to FIG. 17).

When the panel 3 is rotated, the engagement regulating section 34a of the support lever 17 is slid to the left surface of the projection 9, and is rotated in a direction of being moved to the left against a biasing force of the spring member 37 (refer to FIG. 17). In addition, engaging of the engagement regulating section 34a with the engaging recessed portion 9a is released, and then the support state of the panel 3 by the support lever 17 is released (refer to FIG. 18).

The support state of the panel 3 by the support lever 17 is released, and thereby the panel 3 can be removed from the main body 2.

CONCLUSION

As described above, in the in-vehicle electronic apparatus 1, when the panel 3 is moved and locking to the main body 2 by the lock mechanism 14 is released, the holding lever 16 is rotated to the holding position due to inertia, and thus the panel 3 is held by the holding lever 16.

Therefore, since the panel 3 is held by the holding lever 16 in a state in which the panel 3 is unlocked from the main body 2, the panel 3 is rarely dropped by mistake, and thus it is possible to prevent breakdown or damage of the panel 3.

In addition, since the holding lever 16 is rotated due to inertia so as to hold the panel 3, a mechanism for rotating the holding lever 16 is not necessary, and it is possible to prevent breakdown or damage of the panel 3 while achieving reduction in the number of components and simplification of a mechanism of the in-vehicle electronic apparatus 1.

Further, the weight part 33 having a fixed weight is provided in the holding lever 16, and thus the holding lever 16 which is rotated to the holding position due to inertia is rotated to the release position by the self-weight of the weight part 33.

Therefore, a release mechanism which releases a state in which the panel 3 is held by the holding lever 16 is not necessary to be provided, and, accordingly, it is possible to achieve reduction in the number of components and simplification of a mechanism of the in-vehicle electronic apparatus 1.

Furthermore, since the stopper part 15d which stops the holding lever 16 at the release position is provided in the support member 15, a rotated range of the holding lever 16 becomes the minimum, and, accordingly, it is possible to reduce a space for the holding lever 16 and to minimize the in-vehicle electronic apparatus 1.

In addition, since the stopper part 15d is provided in the support member 15 which supports the holding lever 16, a dedicated member for stopping the holding lever 16 at the release position is not necessary, and further it is possible to achieve more reduction in the number of components and more simplification of a mechanism of the in-vehicle electronic apparatus 1.

Further, the holding lever 16 includes the extension part 32 and the weight part 33, the extension part 32 and the weight part 33 extend in a direction approximately perpendicular to each other, and the holding lever 16 is formed approximately Therefore, it is possible to reduce a space for the holding lever 16, and it is possible to further minimize the in-vehicle electronic apparatus 1.

In addition, since the support lever 17 is supported by the support member 15 which supports the holding lever 16 so as to be freely rotatable, a separate member for supporting the holding lever 16 and the support lever 17 is not necessary, and thus it is possible to achieve miniaturization through reduction in the number of components.

It should be understood by those skilled in the art that various modifications, combinations, sub-combinations and alterations may occur depending on design requirements and other factors insofar as they are within the scope of the appended claims or the equivalents thereof.

[Present Technology]

Additionally, the present technology may also be configured as below.

(1) An in-vehicle electronic apparatus including:

a main body that includes a panel attaching/detaching part; and a panel that is attached to and detached from the panel attaching/detaching part, wherein the panel attaching/detaching part is provided with a lock mechanism and a holding lever, the lock mechanism being arranged to lock the panel to the main body, the holding lever being rotatable and being arranged to hold the panel when the holding lever is rotated to a holding position, wherein the panel is moved in a predetermined direction with respect to the main body such that locking of the panel to the main body by the lock mechanism is released, and wherein, when the panel is moved in the predetermined direction such that the locking of the panel to the main body by the lock mechanism is released, the holding lever is rotated to the holding position due to inertia such that the panel is held by the holding lever.

(2) The in-vehicle electronic apparatus according to (1), wherein the holding lever is provided with a weight part having a fixed weight, and wherein the holding lever which is rotated to the holding position due to inertia is rotated to a release position where holding of the panel is released by a self-weight of the weight part.

(3) The in-vehicle electronic apparatus according to (1) or (2), further including:

a support member that supports the holding lever in a manner that the holding lever is freely rotatable, wherein the support member is provided with a stopper part which stops the holding lever at the release position.

(4) The in-vehicle electronic apparatus according to (2) or (3), wherein the holding lever is provided with an extension part which has a holding part engaged with the panel and extends in a predetermined direction, and wherein the extension part and the weight part are provided so as to be substantially perpendicular to each other.

(5) The in-vehicle electronic apparatus according to any one of (1) to (4), further including:

a support member that supports the holding lever in a manner that the holding lever is freely rotatable; and a support lever that supports the panel when the locking of the panel to the main body by the lock mechanism is released, wherein the support lever is supported by the support member in a manner that the support lever is freely moved.

The specific shape and structure of each part shown in the best mode of the above-described technology are only an example of an embodiment when the present technology is carried out, and the technical scope of the present technology should not be construed as being limited thereto.

The present disclosure contains subject matter related to that disclosed in Japanese Priority Patent Application JP 2012-160205 filed in the Japan Patent Office on Jul. 19, 2012, the entire content of which is hereby incorporated by reference.

What is claimed is:

1. An in-vehicle electronic apparatus comprising:

a main body that includes a panel attaching/detaching part; and a panel that is attached to and detached from the panel attaching/detaching part, wherein the panel attaching/detaching part is provided with a lock mechanism and a holding lever, the lock mechanism being arranged to lock the panel to the main body, the holding lever being rotatable and being arranged to hold the panel when the holding lever is rotated to a holding position, wherein the panel is moved in a predetermined direction with respect to the main body such that locking of the panel to the main body by the lock mechanism is released, and wherein, when the panel is moved in the predetermined direction such that the locking of the panel to the main body by the lock mechanism is released, the holding lever is rotated to the holding position due to inertia such that the panel is held by the holding lever, wherein the holding lever is provided with a weight part having a fixed weight, and wherein the holding lever which is rotated to the holding position due to inertia is rotated to a release position where holding of the panel is released by a self-weight of the weight part.

2. The in-vehicle electronic apparatus according to claim 1, further comprising:

a support member that supports the holding lever in a manner that the holding lever is freely rotatable, wherein the support member is provided with a stopper part which stops the holding lever at the release position.

3. The in-vehicle electronic apparatus according to claim 1, wherein the holding lever is provided with an extension part which has a holding part engaged with the panel and extends in a predetermined direction, and wherein the extension part and the weight part are provided so as to be substantially perpendicular to each other.

4. The in-vehicle electronic apparatus according to claim 1, further comprising:

a support member that supports the holding lever in a manner that the holding lever is freely rotatable; and a support lever that supports the panel when the locking of the panel to the main body by the lock mechanism is released, wherein the support lever is supported by the support member in a manner that the support lever is freely moved.

* * * * *